United States Patent
DiMarzio et al.

[11] Patent Number: 5,825,018
[45] Date of Patent: Oct. 20, 1998

[54] OPTICAL LOCK-IN DETECTION TECHNIQUE FOR COHERENT DETECTION APPLICATIONS

[75] Inventors: Charles A. DiMarzio, Cambridge; Scott C. Lindberg, Brighton, both of Mass.

[73] Assignee: Northeastern University, Boston, Mass.

[21] Appl. No.: 583,851

[22] Filed: Jan. 11, 1996

[51] Int. Cl.$^6$ ...................................................... G01J 3/00
[52] U.S. Cl. ................... 250/208.1; 250/208.2; 250/226; 356/346
[58] Field of Search ............... 250/208.1, 208.2, 250/214 R, 226; 356/346, 349; 358/471, 473, 480, 482, 483

[56] References Cited

U.S. PATENT DOCUMENTS

| | | | |
|---|---|---|---|
| 4,042,829 | 8/1977 | Atkinson | 250/550 |
| 4,260,883 | 4/1981 | Onoda et al. | 250/226 |
| 4,637,723 | 1/1987 | Egli et al. | 356/350 |
| 4,668,860 | 5/1987 | Anthon | 250/225 |
| 4,856,899 | 8/1989 | Iwaoka et al. | 356/346 |
| 4,890,925 | 1/1990 | Kitamori et al. | 356/432 |
| 4,907,237 | 3/1990 | Dahmani et al. | 372/32 |
| 4,972,331 | 11/1990 | Chance | 364/550 |
| 5,015,095 | 5/1991 | Hollinger et al. | 356/350 |
| 5,075,793 | 12/1991 | Schiffner | 359/190 |
| 5,122,974 | 6/1992 | Chance | 364/550 |
| 5,135,307 | 8/1992 | de Groot et al. | 356/359 |
| 5,260,772 | 11/1993 | Pollak et al. | 356/417 |
| 5,280,341 | 1/1994 | Monnenmacher et al. | 356/358 |
| 5,311,284 | 5/1994 | Nishino | 356/364 |
| 5,321,502 | 6/1994 | Matsumoto et al. | 356/349 |
| 5,347,359 | 9/1994 | Hutchings et al. | 356/350 |
| 5,408,327 | 4/1995 | Geiler et al. | 356/432 |
| 5,548,124 | 8/1996 | Takeshima et al. | 250/458.1 |

*Primary Examiner*—David C. Nelms
*Assistant Examiner*—John R. Lee
*Attorney, Agent, or Firm*—Weingarten, Schurgin, Gagnebin & Hayes LLP

[57] ABSTRACT

An optical lock-in detection technique and circuit for coherent applications employing a photo-detector having a symmetric I-V curve is presented. The detection circuit includes a photo-detector operating as an optical lock-in amplifier, and a modulation source. The technique and circuit are used for coherent detection applications such as the determination of the frequency of modulation of an optical signal or the determination of the presence of an optical signal at a specified frequency. The technique and circuit are also used with one or more charge coupled devices in imaging applications.

8 Claims, 1 Drawing Sheet

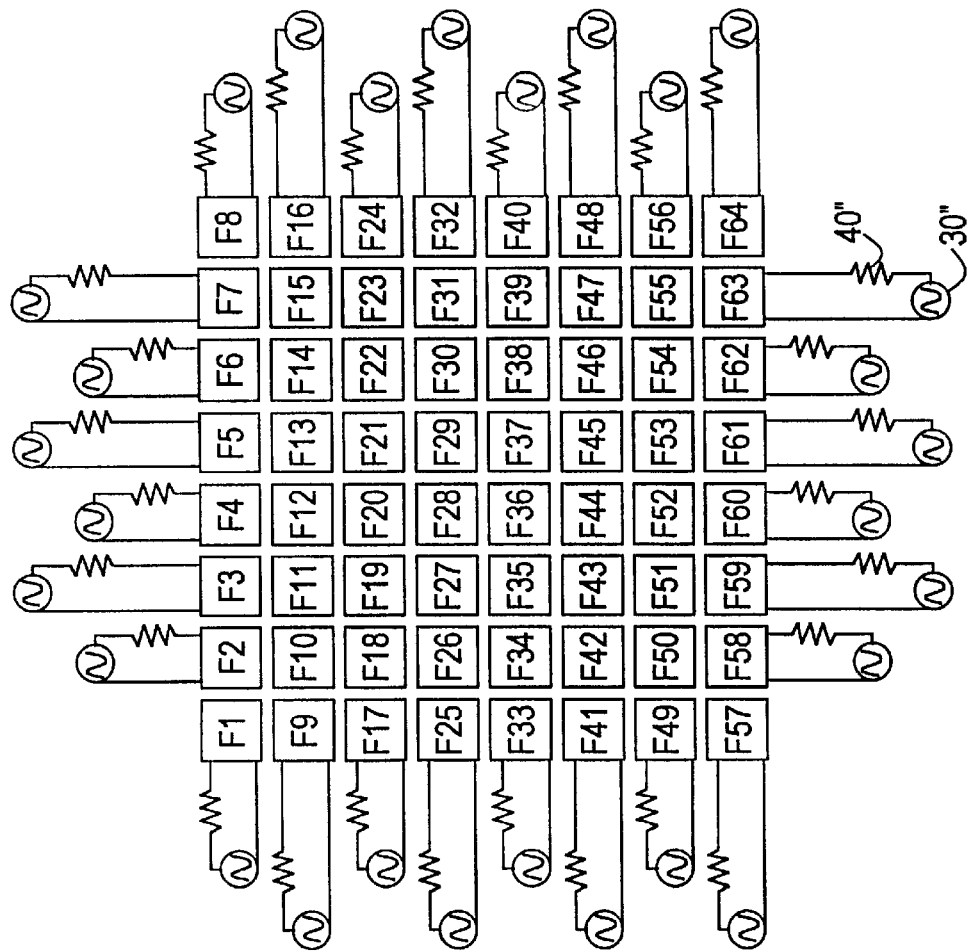
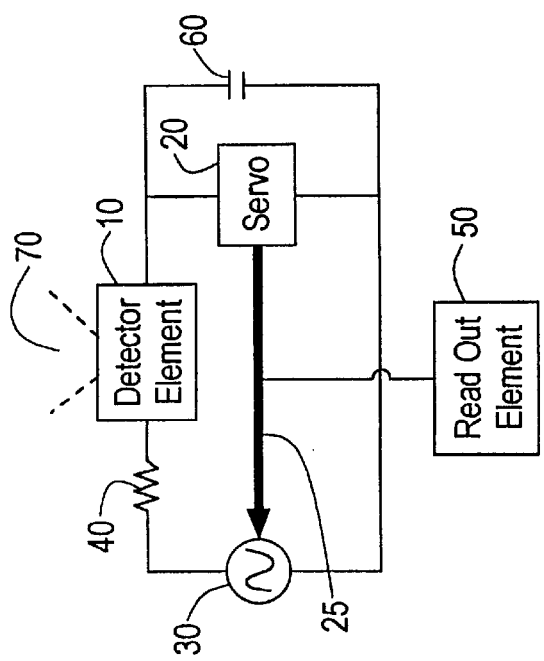
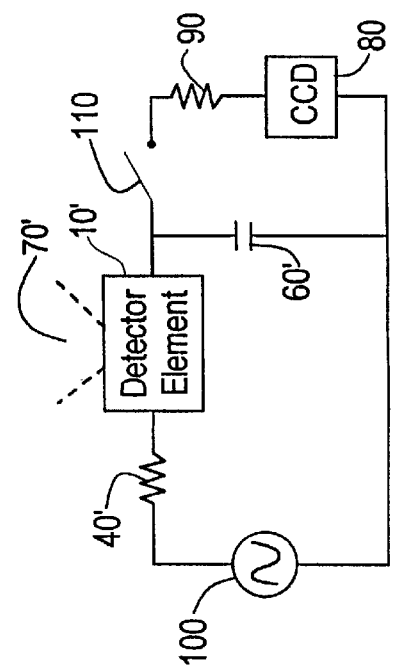
FIG. 3
FIG. 1
FIG. 2

OPTICAL LOCK-IN DETECTION TECHNIQUE FOR COHERENT DETECTION APPLICATIONS

FIELD OF THE INVENTION

The invention relates generally to optical signal detection and more particularly to coherent optical signal detection.

BACKGROUND OF THE INVENTION

As is known in the art, coherent detection involving phase or frequency comparisons between received light and a reference light source generally involves obtaining information one pixel at a time. A scanner, for example, applies a focused light source across an item being scanned. A detector detects the intensity variations in the light reflected back from, or transmitted through, the item being scanned, and converts the variations into electrical signals. Additionally, while scanning, light incident on the detector is normally comprised of a strong reference beam (the focused light source) and a weak signal beam (the light reflected back). For example, the power in the reference beam might be 100 microwatts, while the signal beam may be a picowatt. Therefore, the output of the detector is usually AC coupled to an amplifier in order to reduce the required dynamic range for components after the detector. With such an arrangement, small arrays (typically 3×3 arrays) of detectors can be built, along with the required parallel circuits for amplification and filtering, but these are expensive and do not scale easily to form large arrays, since each detector must have its own amplifier and filter.

Traditional approaches to measuring information such as frequency or phase of an optical signal have included the use of a photo-detector to produce an AC electrical signal corresponding to the optical input signal. The output of the photo-detector is then processed via some type of electrical technique such as an AC lock-in amplifier or spectrum analyzer. The electrical signal, which is representative of the optical signal in terms of phase and frequency with respect to those of the reference beam, is then determined. The disadvantages of this technique are that the lock-in amplifiers or spectrum analyzers require the use of expensive AC components, add complexity, size and weight to the device, and do not lend themselves to use in large arrays. Therefore, there is a need to create an optical lock-in detection method for coherent detection applications that is low cost, simple to implement, and allows for a large degree of scalability.

SUMMARY OF THE INVENTION

An optical lock-in detection method and circuit for coherent detection applications is disclosed. The method uses a photo-detector having a symmetric I-V curve and which functions as a lock-in amplifier. A modulation source causes the photo-detector to move along the symmetric I-V curve. If the frequency of the external optical signal modulation substantially matches that of the modulation source, a DC signal will be produced. If the frequency of the external optical signal modulation does not substantially match that of the modulation source, an AC signal will be produced. With such a method and circuit the frequency and phase of an applied optical signal can be determined. Additionally, the method and circuit can be used to detect the presence of an optical signal at a desired frequency.

Applications of such a technique include, but are not limited to: industrial uses such as ranging measurements in optical component testing or surface contour mapping of integrated circuits; Doppler imaging in Light Detection and Ranging (LIDAR) or in sensors for surveillance; medical imaging such as mammography, brain hemoglobin oxygenation measurement, and retinal analysis; and as optical sensors or AC magnetic field sensors.

BRIEF DESCRIPTION OF THE DRAWINGS

FIG. 1 is a schematic of an optical lock-in detection circuit used in determining the frequency and phase of an applied optical signal;

FIG. 2 is a schematic of the optical lock-in detection circuit of FIG. 1 incorporating a Charge Coupled Device (CCD) for use in video imaging applications; and FIG. 3 is a schematic of an array of CCDs, each having a respective modulation source and load resistor.

DESCRIPTION OF THE PREFERRED EMBODIMENT

FIG. 1 shows a detector element 10 in series with a servo 20, with a Voltage Controlled Oscillator (VCO) 30, and with a load resistor 40. A capacitor 60 is in parallel with servo 20. The servo 20 provides a control signal for adjusting the output of the VCO 30 via control path 25. A read out element 50 is provided for determining the output of the servo 20.

Detector element 10 in one embodiment includes a single, fast photo-conductive element. The photo-conductive element is responsive to light, producing an electrical output which is representative of and corresponds to the optical signal 70. The VCO 30 is a variable oscillator, with the frequency of the oscillator determined by the DC voltage applied to it by the servo 20 via the control path 25. The photo-detector is modulated by the VCO 30. The servo 20 causes the VCO 30 to sweep through a range of frequencies. If the frequency of the optical signal 70 applied to the detector element 10 is at or substantially close to the frequency of the VCO 30, the detector element 10 will output a DC voltage, which charges capacitor 60. If the frequency of the VCO 30 is not substantially near or at the frequency of the optical signal 70, the detector element 10 will output an AC signal.

In such a manner, the frequency of the optical signal 70 can be determined by monitoring the output of the detector element 10 for the maximum DC voltage output. The output of the detector element 10 can be monitored at the output of the detector element 10 itself, at the servo 20, or at the capacitor 60. The output may be monitored by a voltmeter, an oscilloscope or by other manners which are known in the art. The frequency of the VCO 30 at the time when the detector element 10 provides a maximum DC voltage corresponds to the frequency of the applied optical signal 70. The frequency of the VCO 30 can be measured by either measuring the output of the servo 20 on the control path 25 by use of read out element 50 (assuming the relationship between servo 20 voltage and VCO 30 output is known), or by measuring the frequency of the signal across the load resistor 40.

FIG. 2 shows a circuit for detecting the presence of an optical signal at a desired frequency. FIG. 2 has a load resistor 40', capacitor 60' and detector element 10' as in FIG. 1, but the VCO 30 of FIG. 1 is replaced with a modulation source 100, and a normally open switch 110 (typically a transistor or reed relay). The modulation source in a first embodiment of the present invention operates at a fixed frequency, and in a second embodiment is tunable to different frequencies. A resistor 90 and CCD element 80 are added in parallel with capacitor 60'. With the circuit of FIG. 2, the modulation source 100 is either fixed at or tuned to a predetermined frequency which is the frequency of light to be detected. If the optical signal 70' is substantially near or at the same frequency as the frequency source 100, a DC signal will be produced by detector element 10'. If, on the other hand, optical source 70' is not substantially close to or at the same frequency as the modulation source 100, an AC signal will be produced by detector element 10', indicating that the optical signal 70' is not at or substantially near the frequency of the frequency source 100. Additionally, "frames" of data relating to the frequency of the optical signal 70' can be created by closing switch 110 for a set period of time, thereby providing the output of the detector element 10' through resistor 90 and into CCD element 80. With successive switching of switch 110, for example at rates of 1/30th of a second, a video signal comprised of a succession of frames which are representative of the optical signal 70' can be provided.

FIG. 3 depicts an array of elements F1–F64 having respective modulation sources 30". Array elements F1–F64 are representative of detector element 10', capacitor 60', switch 110, resistor 90 and CCD element 80 as shown in FIG. 2. In the illustrated embodiment, each modulation source 30" is at a different frequency, thus providing frequency detection at multiple frequencies of a single optical signal applied to all of the array elements F1–F64.

In a second embodiment, the array of elements are coupled to a single VCO, thereby providing a large area detection array. Here, the VCO is maintained at a single frequency or is adjusted dynamically as required by the specific application.

In a third embodiment useful for scanning, each array element has a respective VCO as a modulation source, with each array element receiving an individual optical signal. The frequency of each input of an array of optical signal inputs is determined. Thus, large arrays using CCDs (1,000× 1,000 or more) may be implemented without requiring a large amount of support electronics or a large amount of space. A 1,000×1,000 array built according to traditional techniques requires one million lock-in amplifiers or spectrum analyzers. However, in the present invention, one million photo-detectors can be fabricated in a small amount of space, and can be modulated with a small number of modulation sources, resulting in an array costing much less than that with conventionally built arrays.

Having described preferred embodiments of the invention it will now become apparent to those of ordinary skill in the art that other embodiments incorporating these concepts may be used. Accordingly, it is submitted that the invention should not be limited to the described embodiments but rather should be limited only by the spirit and scope of the appended claims.

We claim:

1. An optical detector comprising:

a detector element responsive to an optical signal;

a modulation source in communication with and modulating said detector element with a modulating signal, wherein said detector element provides a DC output signal when a frequency of said optical signal is substantially equal to a frequency of said modulating signal, said detector element providing an AC output signal when said frequency of said optical signal is not substantially equal to said modulating frequency;

a Charge Coupled Device (CCD); and a switch element, said switch element periodically supplying said output signal of said detector element to said CCD.

2. The optical detector of claim 1 wherein said switch element is a transistor.

3. The optical detector of claim 1 wherein said switch element is a relay.

4. An optical detector comprising:

a plurality of modulation sources;

a plurality of detector elements, each of said detector elements responsive to an optical signal, each of said detector elements communicating with and modulated by respective one of said plurality of modulation sources, each of said detector elements providing a DC output signal when a frequency of said optical signal is substantially equal to a frequency provided by said respective modulation source, each of said detector elements providing an AC output signal when the frequency of said optical signal is not substantially equal to the frequency provided by said respective modulation source;

a plurality of Charge Coupled Devices (CCDs); and a plurality of switch elements, each of said switch elements periodically supplying an output signal of a respective detector element to a respective CCD.

5. An optical detector comprising:

a plurality of modulation sources;

a plurality of detector elements, each of said detector elements responsive to a respective one of a plurality of optical signals, each of said detector elements communicating with and modulated by a respective one of said plurality of modulation sources, each of said detector elements providing a DC output signal when a frequency of said respective optical signal is substantially equal to a frequency provided by said respective modulation source, each of said detector elements providing an AC output signal when said frequency of said respective optical signal is not substantially equal to the frequency provided by said respective modulation source;

a plurality of Charge Coupled Devices (CCDs); and a plurality of switch elements, each of said switch elements periodically supplying an output signal of a respective detector element to a respective CCD.

6. A method of optical detection comprising the steps of:

providing an input optical signal;

detecting said optical signal using a detector element responsive to said optical signal;

modulating said detector element at a modulation frequency using a modulation source connected to said detector element;

measuring an output signal produced by said detector element wherein said output signal has a first characteristic when the frequency of said modulating frequency is substantially equal to the frequency of said optical signal;

supplying said output signal produced by said detector element to a Charge Coupled Device (CCD) by a switch element connected therebetween; and storing said output signal produced by said detector element in said CCD.

7. A method of optical detection comprising the steps of:

detecting an optical signal using a plurality of detector elements, each detector element responsive to said optical signal and providing an output signal;

modulating each of said detector elements using a modulation source;

supplying said output signals produced by said detector elements to a plurality of Charge Coupled Devices (CCDs) via a plurality of switch elements; and storing said output signals produced by said detector elements in said CCDs.

8. The method according to claim 7 wherein said step of detecting an optical signal comprises detecting a plurality of optical inputs and wherein said step of modulating each of said detector elements using a modulation source further comprises modulating said detector elements using a plurality of respective modulation elements.

* * * * *